(12) United States Patent
Liao et al.

(10) Patent No.: US 7,944,145 B2
(45) Date of Patent: May 17, 2011

(54) CHARACTER DISPLAY MODULE

(75) Inventors: Yu-Pin Liao, Taichung (TW); Ying-Ju Liu, Taichung (TW)

(73) Assignee: Winstar Display Co., Ltd., Taichung (TW)

( * ) Notice: Subject to any disclaimer, the term of this patent is extended or adjusted under 35 U.S.C. 154(b) by 264 days.

(21) Appl. No.: 12/422,279

(22) Filed: Apr. 12, 2009

(65) Prior Publication Data

US 2010/0213836 A1  Aug. 26, 2010

(30) Foreign Application Priority Data

Feb. 25, 2009  (TW) ................ 98106005 A

(51) Int. Cl.
*H01J 1/62* (2006.01)

(52) U.S. Cl. ........................................ 313/513; 313/504

(58) Field of Classification Search .................. 313/498, 313/504, 506, 509, 512, 513
See application file for complete search history.

(56) References Cited

U.S. PATENT DOCUMENTS

| 7,030,546 | B2 * | 4/2006 | Han et al. ...................... 313/402 |
| 7,282,852 | B2 * | 10/2007 | Tajima et al. ................. 313/497 |
| 2008/0198297 | A1 * | 8/2008 | Choi et al. ..................... 349/65 |

* cited by examiner

*Primary Examiner* — Vip Patel

(57) ABSTRACT

A character display module comprises a character organic light emitting diode panel, a printed circuit which is electrically connected to the character organic light emitting diode panel, a drive controller which is disposed on the printed circuit board to drive and control the character organic light emitting diode panel, and a frame which is used to position the character organic light emitting diode panel on the printed circuit board. Therefore, such an arrangement provides a lighter, thinner, high quality, cost-saving and energy-saving character display module.

46 Claims, 7 Drawing Sheets

CHARACTER DISPLAY MODULE

BACKGROUND OF THE INVENTION

1. Field of the Invention

The present invention relates to a display module; and more particularly to a character organic light emitting diode display module.

2. Description of the Prior Art

Liquid crystal display (LCD) is considered to be the mainstream of flat panel display (FPD). Although the LCD is widely used, the LCD panel must use a backlight module as a light source, and enough space must be reserved on the LCD for installation of the backlight module, thus increasing the thickness and weight of the LCD. In addition, the backlight module causes additional power consumption while increasing cost. The existing LCDs all suffer from the disadvantages of narrow viewing angle and low response speed, which are likely to induce image sticking problem.

The present invention has arisen to mitigate and/or obviate the afore-described disadvantages.

SUMMARY OF THE INVENTION

The primary objective of the present invention is to provide a character organic light emitting diode display module, which can save cost and space because of no need for backlight module, and can further save energy due to direct photoelectric conversion, and can improve the image quality and response speed, wide the viewing angle, and enhance contrast so as to wide the application range by means of a character organic light emitting diode panel.

The secondary objective of the present invention is to provide a character organic light emitting diode display module, which comprises a character generator read-only memory, a character generator random-access memory, a reset integrated circuit, and a power supplying circuit. The character generator read-only memory is interiorly provided with a multi-language character database, and the character generator random-access memory is interiorly provided with a plotting function. The reset integrated circuit is employed to provide a reset function. The power supplying circuit is employed to supply a working power. Such an arrangement can improve drive convenience and perfect functions.

DETAILED DESCRIPTION OF THE PREFERRED EMBODIMENTS

Figure 1:
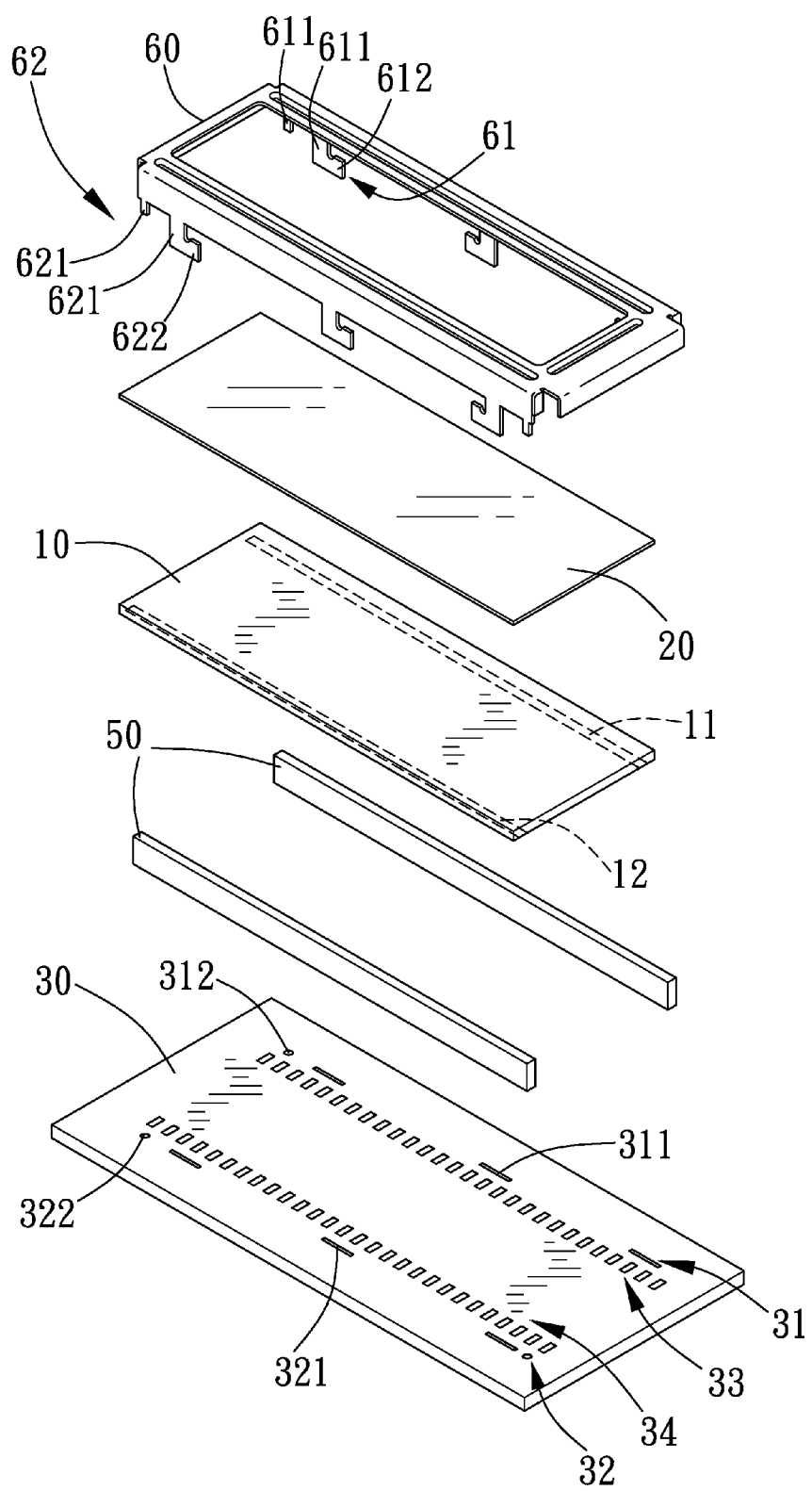
FIG. 1 is an exploded of a character display module in accordance with the present invention.
Figure 2:
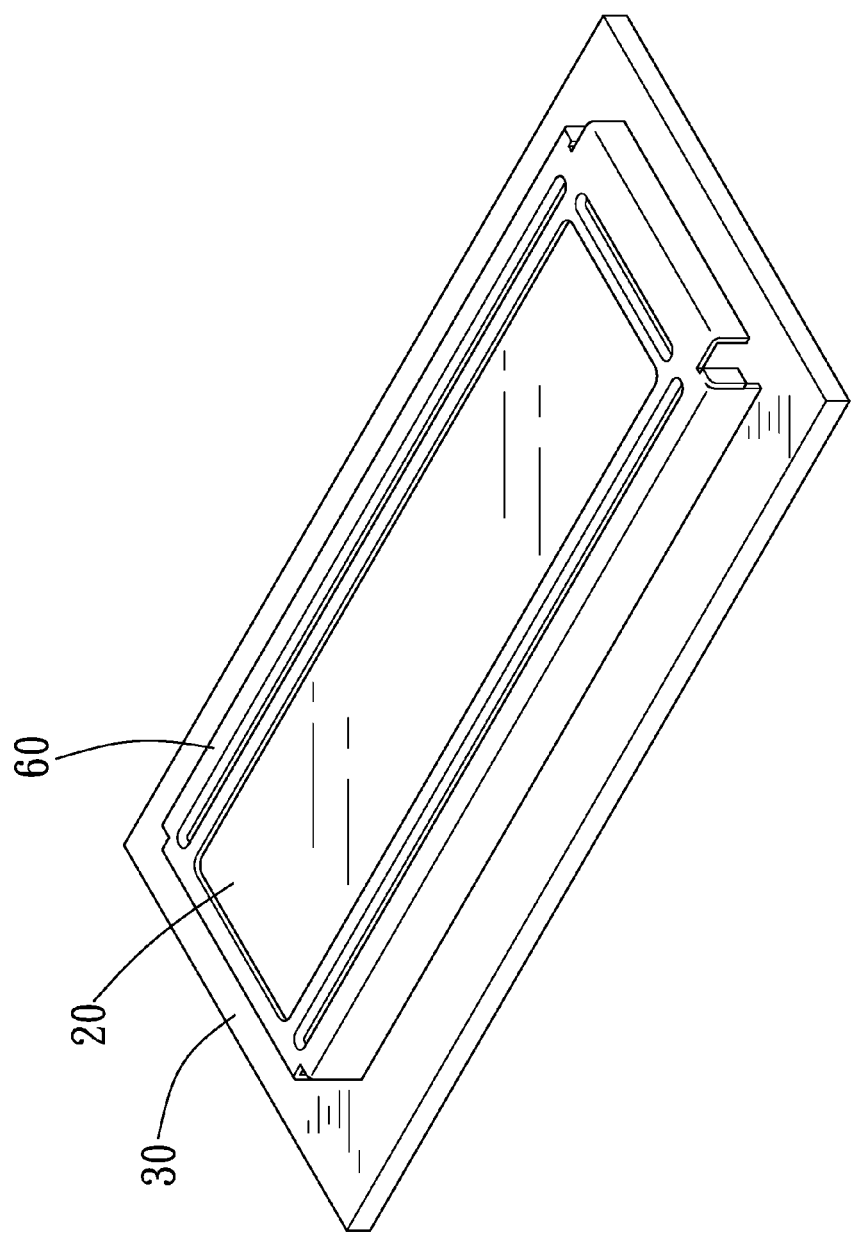
FIG. 2 is a perspective view of the character display module in accordance with the present invention.

The present invention will be clearer from the following description when viewed together with the accompanying drawings, which show, for purpose of illustrations only, the preferred embodiment in accordance with the present invention.

FIGS. 1-7 show a character display module in accordance with a preferred embodiment of the present invention.

Referring to FIGS. 1-5, the character display module in accordance with the present invention comprises a character organic light emitting diode panel 10, a polarizing film 20, a printed circuit board 30, a drive controller 40, two conductive components 50, and a frame 60.

The organic light emitting diode panel 10 is of 5×8 or 5×10 (preferably 5×8) dot-matrix display, wherein each character consists of 5×8 or 5×10 dots. The characters of the organic light emitting diode panel 10 are arranged in an array ranging: from 4(rows)×1(column)-100×1 to 4×10-100×10, preferably 8×1, 8×2, 16×1, 16×1, 16×2, 16×4, 20×1, 20×2, 20×4, 40×1, 40×1, 40×2 or 40×4.

The organic light emitting diode panel 10 has a thickness between 0.4 mm and 5 mm, preferably 0.4 mm, 0.5 mm, 0.55 mm, 0.7 mm, 1.0 mm, 1.1 mm, 1.4 mm or 2.0 mm, a chromaticity coordinate of X: from 0.1 to 0.8 and Y: from 0.1 to 0.8, a luminous efficiency ranging from 0.65 to 65 lm/W, and a service life from 20 k to 2000 k hours and more.

The organic light emitting diode panel 10 is oppositely provided with a first connecting portion 11 and a second connecting portion 12.

As compared to the character LCD panel, the character organic light emitting diode panel 10 has the following advantages:

1. Self-luminous: the character organic light emitting diode panel 10 is a photoelectric component to convert electric energy into light.

2. Direct-current low voltage drive (lower than 16 v).

3. High power efficiency: only the self-luminous pixels consume electric power, so that the power consumption of the character organic light emitting diode panel 10 is lower than the cathode ray tube (CRT) and the thin film transistor liquid crystal display (TFT-LCD), and since the character organic light emitting diode panel 10 is a self-luminous component, there is no need for the backlight module with high power consumption disadvantage, thus further saving electric power.

4. High brightness: high quality image with the features of the CRT and the TFT-LCD, the brightness exceeds 100000 $cd/m^2$, and in a low brightness environment, 5 $cd/m^2$ is bright enough to clearly display the information.

5. Fast response time: the unit of the response time of the character organic light emitting diode panel 10 is expressed in μsec, the unit of the response time of the LCD is expressed in msec and the response time of the character organic light emitting diode panel 10 of the present invention is over 1000 times faster than the response time of TFT-LCD, which is 50 msec, and the response time of super twisted nematic liquid crystal display, which is 100 msec, thus making the image tend to be more true.

6. Light weight & slime: since the backlight module is unneeded, the thickness of the panel can be reduced to be smaller than 2 mm.

7. High reliability: with the brightness of 100 $cd/m^2$, the character organic light emitting diode panel 10 of the present invention has a service life longer than 100000 hrs, and due to simple configuration, the character organic light emitting diode panel 10 of the present invention is more durable, thus being applicable to the field of high impact and great temperature change.

8. Full viewing angle: the upper, lower, left and right viewing angles are all more than 175 degrees.

9. Excellent uniformity.

10. High effective contrast ratio.

The polarizing film 20 is a 1/10-to-1/2 (preferably 1/4) wavelength type film, namely the wavelength of the light passing through the polarizing film 20 is from 1/10 to 1/2 of the wavelength of the light entering the polarizing film 20, and the wavelength of the light entering the polarizing film 20 ranges from 400 nm to 700 nm. The polarizing film 20 is disposed on a light emission path of the character organic light emitting diode panel 10, thus improving the contrast ratio of the character organic light emitting diode panel 10, and further utilizing the polarizing film 20 with different wave lengths to filter light to change the emitting color.

The thickness of the printed circuit board 30 ranges from 0.2 mm to 10 mm (preferably, 0.4 mm, 0.6 mm. 0.8 mm, 1.0 mm or 1.6 mm).

The printed circuit board 30 is oppositely provided on one side thereof with a first assembling portion 31 and a second assembling portion 32. The first assembling portion 31 is defined with three insertion holes 311 and a through hole 312, and the second assembling portion 32 is also defined with three insertion holes 321 and a through hole 322 corresponding to the first assembling portion 31. The first assembling portion 31 is provided at an inner side thereof with a first connecting portion 33 in alignment with the first connecting portion 11 of the character organic light emitting diode panel 10, and the second assembling portion 32 is provided with at an inner side thereof with a second connecting portion 34 in alignment with the second connecting portion 12 of the character organic light emitting diode panel 10. The printed circuit board 30 is electrically connected to a resistor which is used to adjust the brightness, the power consumption (limiting current and improving voltage conversion efficiency can reduce the power consumption), and the pre-charging time.

Figure 3:
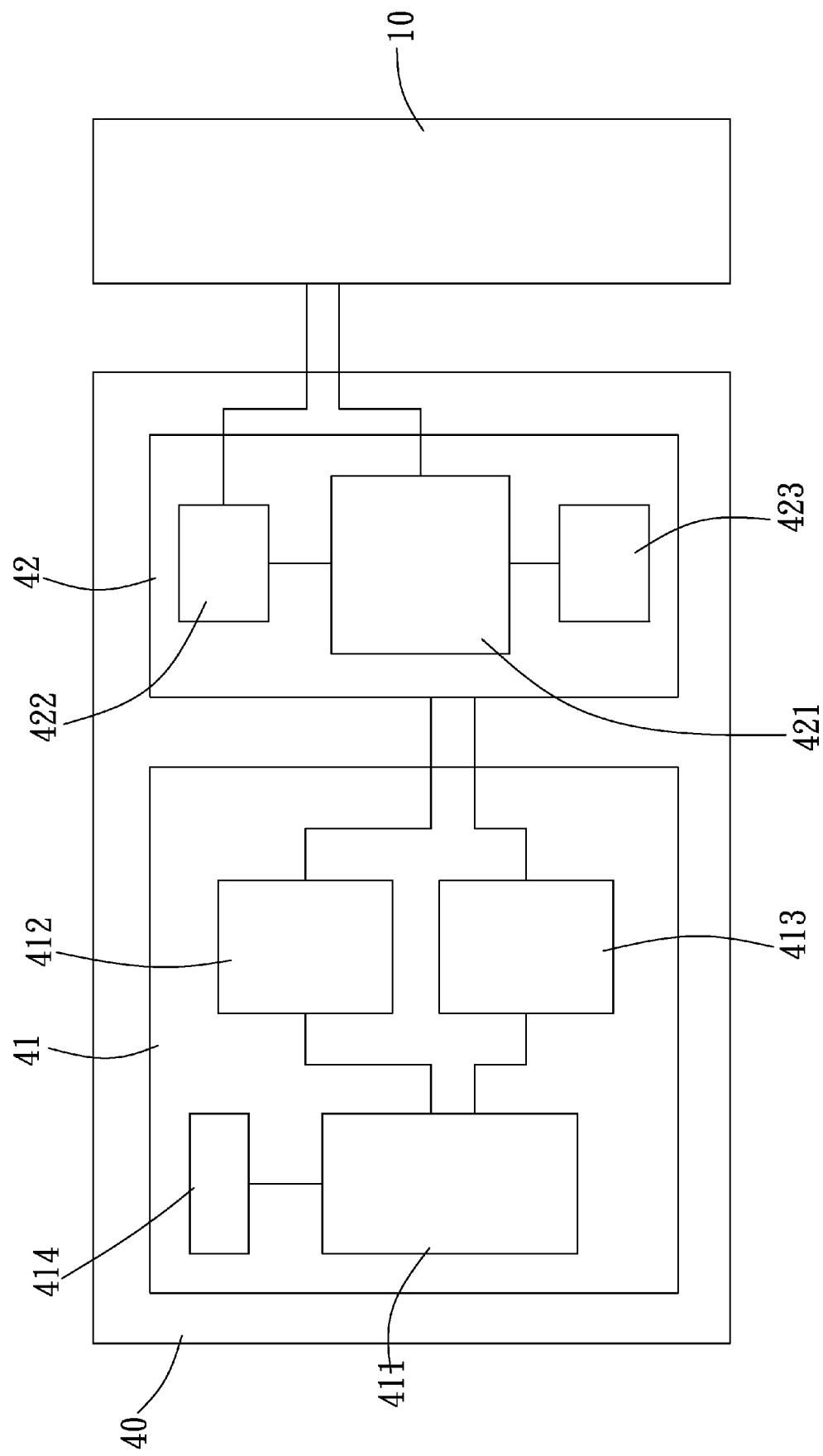
FIG. 3 is a block diagram showing how a drive controller cooperates with a character organic light emitting diode panel in accordance with the present invention.
Figure 4:
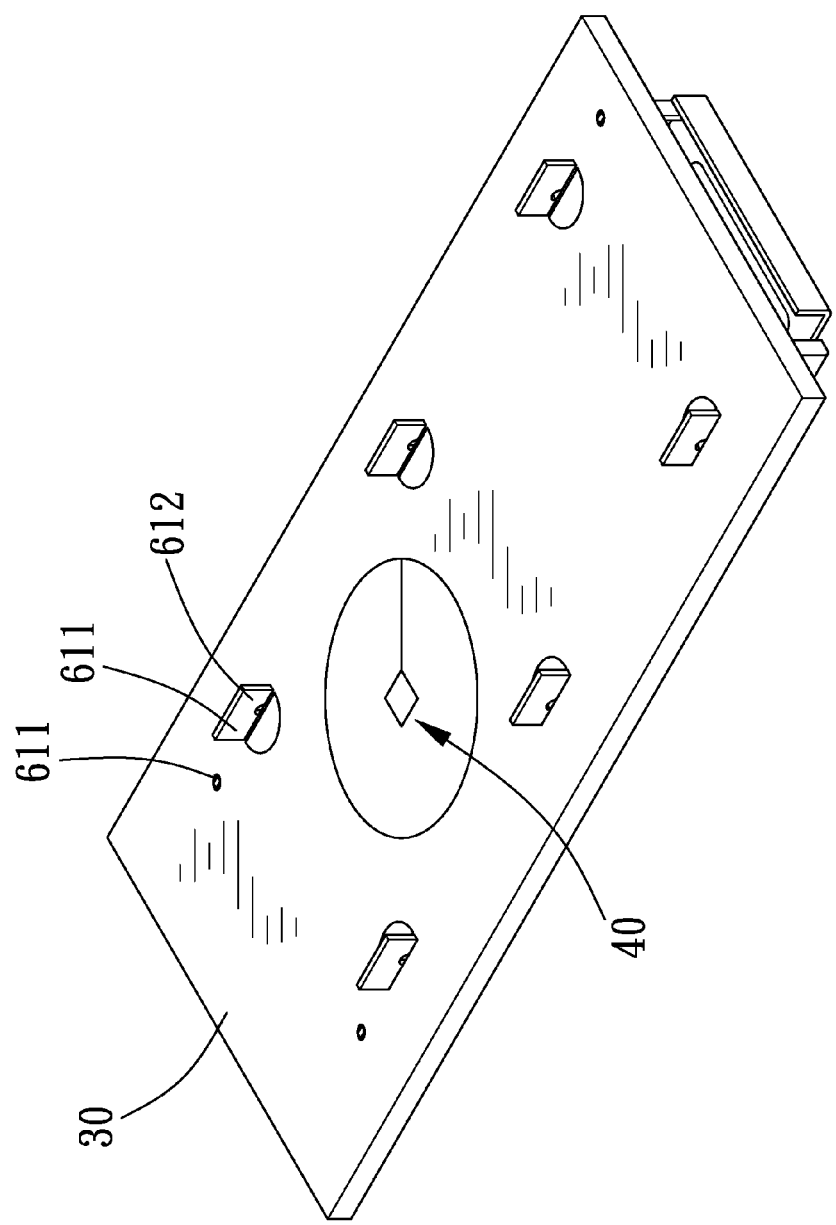
FIG. 4 is a first combination view of a printed circuit board and a frame in accordance with the present invention.
Figure 5:
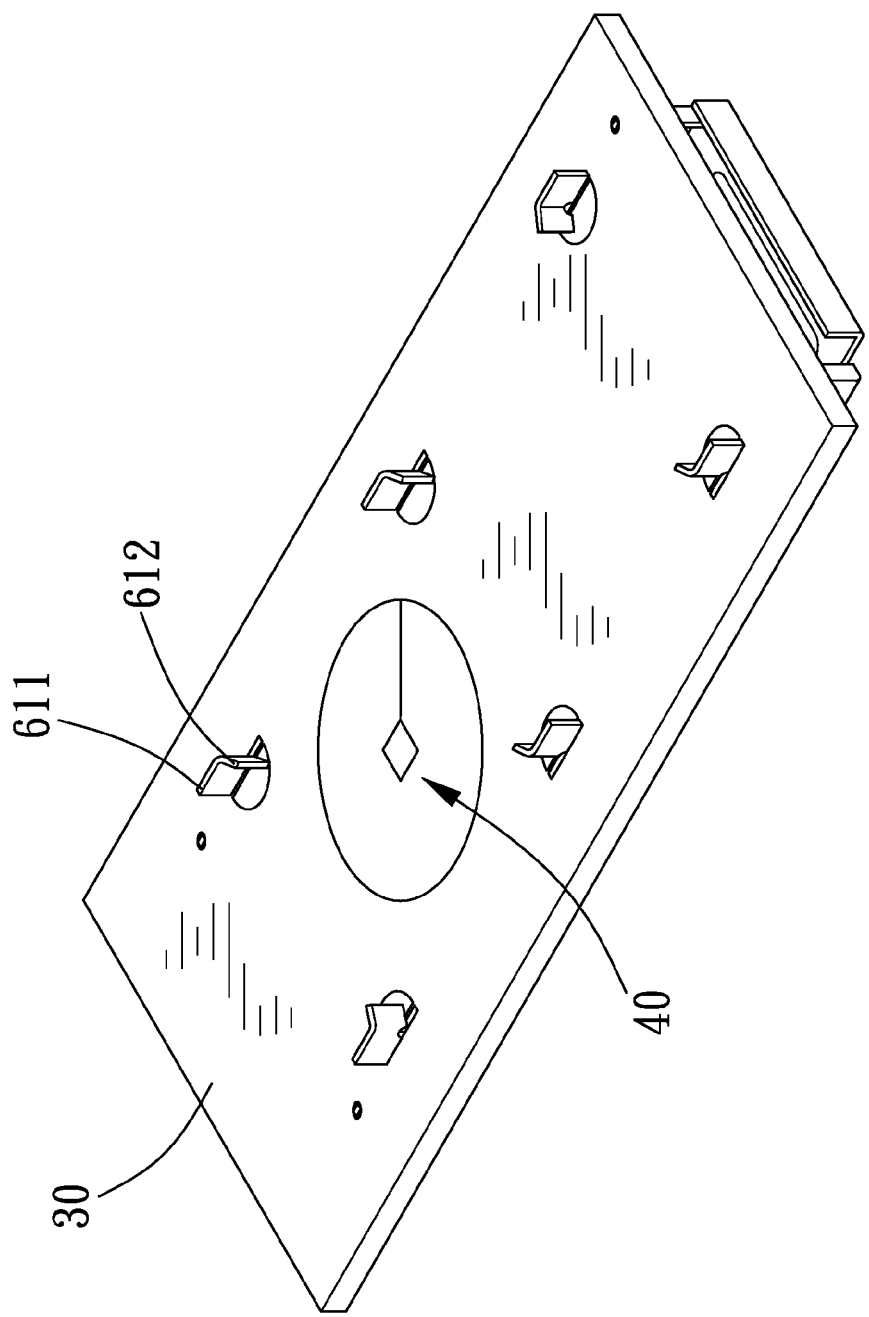
FIG. 5 is a second combination view of the printed circuit board and the frame in accordance with the present invention.
Figure 6:
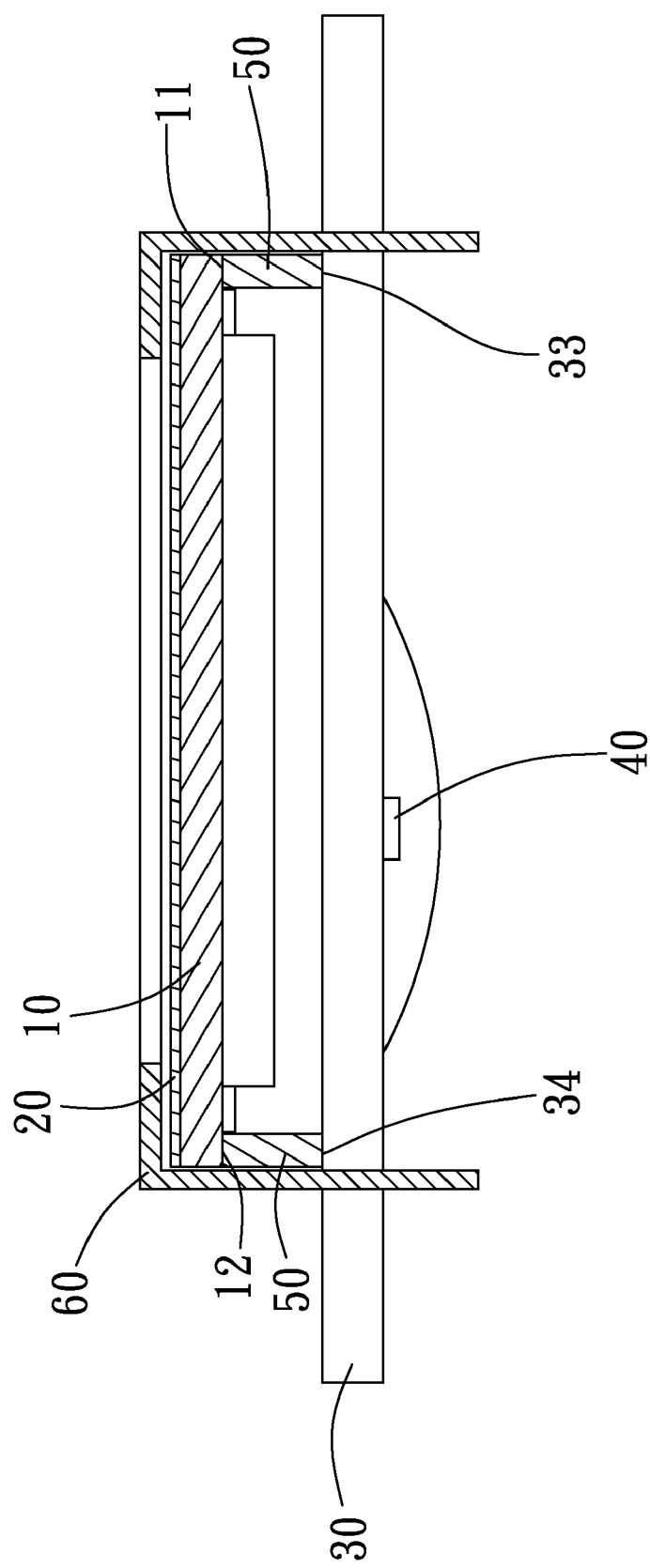
FIG. 6 is a cross-sectional view of the character display module in accordance with the present invention.
Figure 7:
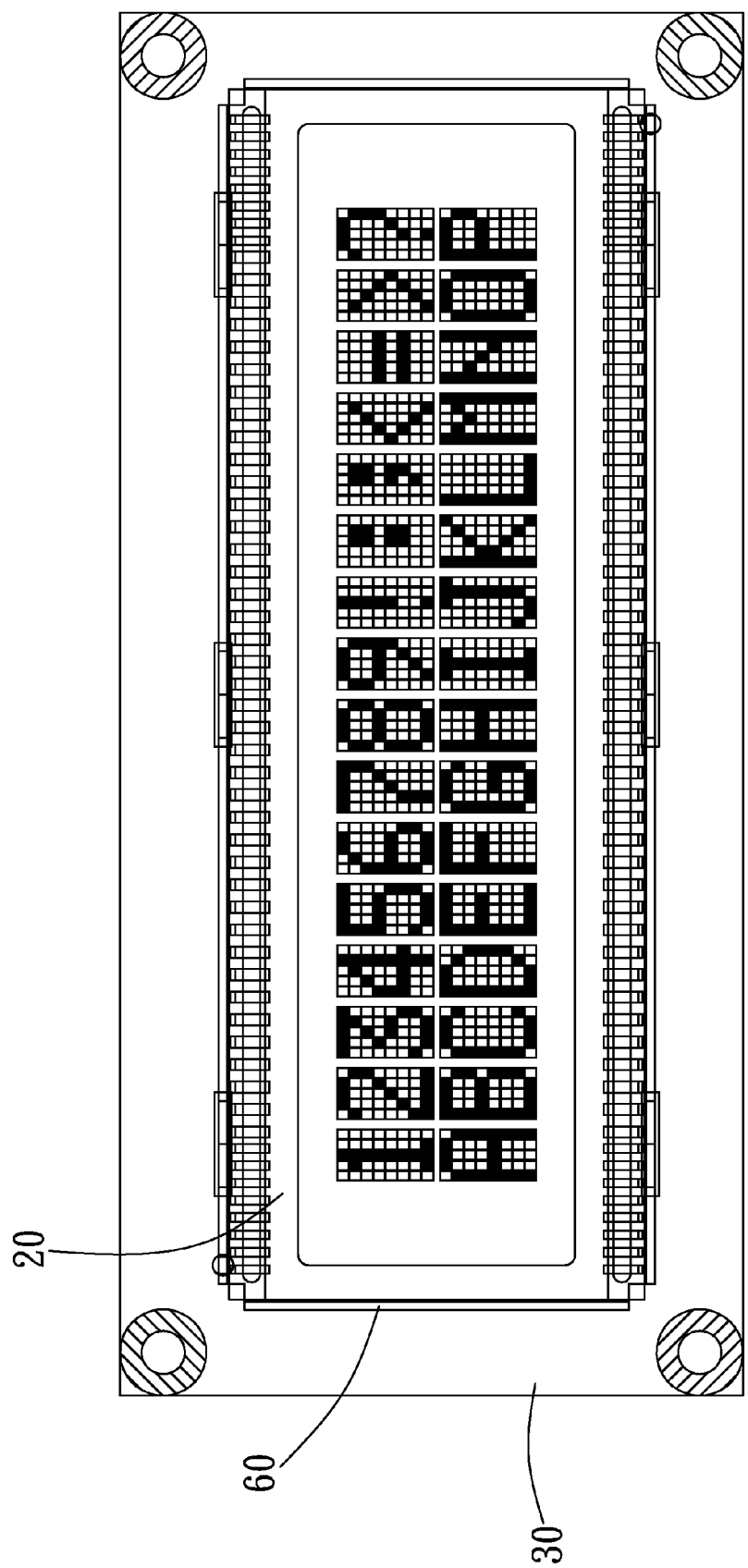
FIG. 7 is an operative view of the character organic light emitting diode panel in accordance with the present invention.

Referring to FIG. 3, the drive controller 40 includes a panel control unit 41 and a panel drive unit 42.

The panel control unit 41 is provided with a micro control integrated circuit 411, a character generator read-only memory 412, a character generator random-access memory 413 and a reset integrated circuit 414. The micro control integrated circuit 411 includes a 4/8-bit 6800/8080-series parallel interface or serial interface. The character generator read-only memory 412 is electrically connected to the micro control integrated circuit 411 and interiorly provided with a 64×8 bit multi-language character database. The character generator random-access memory 413 is electrically connected to the micro control integrated circuit 411 and interiorly provided with a 100×16 plotting function. The reset integrated circuit 414 is electrically connected to the micro control integrated circuit 411 to provide a reset function.

The resolution of the panel drive unit 42 is set to 5×8 or 5×10 correspondingly to the character organic light emitting diode panel 10. The panel drive unit 42 is electrically connected to the character generator read-only memory 412 and the character generator random-access memory 413, respectively. The panel drive unit 42 is provided with a common drive circuit 421, a section control circuit 422 which is electrically connected to the common drive circuit 421, and a power supplying circuit 423 which is electrically connected to the section control circuit 422. The common drive circuit 421 and the section control circuit 422 are operatively connected the character organic light emitting diode panel 10, respectively. The power supplying circuit 423 supplies a working power to the panel drive unit 42 by means of DC/DC (direct current) conversion.

The respective conductive components 50 are made of a liquid, solid or colloid elastic conductive material (preferably conductive rubber, silver adhesive, carbon powder, anisotropic conductive film, or flexible flat cable). The respective conductive components 50 are disposed between the character organic light emitting diode panel 10 and the printed circuit board 30 in such a manner that one of the two conductive components 50 is abuttingly connected to the first connecting portion 33 of the printed circuit board 30 and the first connecting portion 11 of the character organic light emitting diode panel 10, and the other of the two conductive components 50 is abuttingly connected to the second connecting portion 34 of the printed circuit board 30 and the second connecting portion 12 of the character organic light emitting diode panel 10, so that the character organic light emitting diode panel 10 can be controlled and driven by the drive controller 40.

The frame 60 is made of metal (iron or stainless steel) or non-metal. The frame 60 is provided at both sides thereof with a first positioning portion 61 in alignment with the first assembling portion 31 of the printed circuit board 30, and a second positioning portion 62 in alignment with the second assembling portion 32 of the printed circuit board 30. The first positioning portion 61 is provided with four positioning protrusions 611, three of which each include a flexible end 612, and the second positioning portion 62 is provided with four positioning protrusions 621, three of which each include a flexible end 622. The positioning protrusions 611 of the first positioning portion 61 can be inserted into the insertion holes 311 and the through hole 312 of the first assembling portion 31 and engaged to the printed circuit board 30 by the flexible ends 612, and the second positioning protrusions 621 of the second positioning portion 62 can be inserted into the insertion holes 321 and the through hole 322 of the second assembling portion 32 and engaged to the printed circuit board 30 by the flexible ends 622, so that the character organic light emitting diode panel 10 can be positioned on the printed circuit board 30 by the frame 60.

While we have shown and described various embodiments in accordance with the present invention, it is clear to those skilled in the art that further embodiments may be made without departing from the scope of the present invention.

What is claimed is:

1. A character display module comprising:
   a character organic light emitting diode panel being provided with a first connecting portion and a second connecting portion;
   a polarizing film being disposed on a light emission path of the character organic light emitting diode panel;
   a printed circuit board being provided with a first assembling portion and a second assembling portion, the printed circuit board being further provided at one side of the first assembling portion thereof with a first connecting portion in alignment with the first connecting portion of the character organic light emitting diode panel, and at one side of the second assembling portion thereof with a second connecting portion in alignment with the second connecting portion of the character organic light emitting diode panel;
   a drive controller including a panel control unit and a panel drive unit;
   plural conductive components being disposed between the character organic light emitting diode panel and the printed circuit board and connected to the first connecting portions of the printed circuit board and the character organic light emitting diode panel, and the second connecting portions of the printed circuit board and the character organic light emitting diode panel, so that the character organic light emitting diode panel is controlled and driven by the panel control unit and the panel drive unit of the drive controller; and a frame being provided with a first positioning portion to be engaged to the first assembling portion of the printed circuit board, and a second positioning portion to be engaged to the second assembling portion of the printed circuit board, so that the character organic light emitting diode panel is positioned on the printed circuit by the frame.

2. The character display module as claimed in claim 1, wherein the character organic light emitting diode panel is of a dot-matrix display.

3. The character display module as claimed in claim 2, wherein the character organic light emitting diode panel is of a 5×8 dot-matrix display to cooperate with the panel control unit and the panel drive unit.

4. The character display module as claimed in claim 2, wherein the character organic light emitting diode panel is of a 5×10 dot-matrix display to cooperate with the panel control unit and the panel drive unit.

5. The character display module as claimed in claim 3, wherein each character consists of 5×8 dots, and characters are arranged in an array from 4×1-100×1 to 4×40-4×100.

6. The character display module as claimed in claim 5, wherein the characters are preferably arranged in an array of 8×1, 8×2, 16×1, 16×2, 20×1, 20×2, 20×4, 40×1, 40×2, or 40×4.

7. The character display module as claimed in claim 4, wherein each character consists of 5×10 dots, characters are arranged in an array from 4×1-100×1 to 4×40-4×100.

8. The character display module as claimed in claim 7, wherein the characters are preferably arranged in an array of 8×1, 8×2, 16×1, 16×2, 20×1, 20×2, 20×4, 40×1, 40×2, or 40×4.

9. The character display module as claimed in claim 1, wherein a thickness of the character light emitting diode panel ranges from 0.4 mm to 5 mm.

10. The character display module as claimed in claim 9, wherein the thickness of the character light emitting diode panel is preferably 0.4 mm, 0.5 mm, 0.55 mm, 0.7 mm, 1.0 mm, 1.1 mm, 1.4 mm or 2.0 mm.

11. The character display module as claimed in claim 1, wherein the character light emitting diode panel has a chromaticity coordinate of X: from 0.1 to 0.8 and Y: from 0.1 to 0.8.

12. The character display module as claimed in claim 1, wherein the character light emitting diode panel has a luminous efficiency ranging from 0.65 to 65 lm/W.

13. The character display module as claimed in claim 1, wherein the character light emitting diode panel has a service life ranging from 20 k to 2000 k hours and more.

14. The character display module as claimed in claim 1, wherein a wavelength of a light passing through the polarizing film is from $1/10$ to $1/2$ of a wavelength of a light entering the polarizing film.

15. The character display module as claimed in claim 14, wherein the wavelength of the light passing through the polarizing film is $1/4$ of the wavelength of the light entering the polarizing film.

16. The character display module as claimed in claim 1, wherein a wavelength of a light entering the polarizing film ranges from 400 nm to 700 nm.

17. The character display module as claimed in claim 1, wherein a thickness of the printed circuit board ranges from 0.2 mm to 10 mm.

18. The character display module as claimed in claim 17, wherein the thickness of the printed circuit board is preferably 0.4 mm, 0.6 mm, 0.8 mm, 1.0 mm or 1.6 mm.

19. The character display module as claimed in claim 1, wherein the printed circuit board is electrically connected to a resistor.

20. The character display module as claimed in claim 1, wherein the first assembling portion and the second assembling portions of the printed circuit board each are provided with insertions holes and through holes to cooperate with the first positioning portion and the second positioning portion.

21. The character display module as claimed in claim 1, 3 or 4, wherein the panel control unit of the drive controller is provided with a micro control integrated circuit, a character generator read-only memory, a character generator random-access memory and a reset integrated circuit to cooperate with the panel drive unit of the drive controller.

22. The character display module as claimed in claim 21, wherein the micro control integrated circuit of the panel control unit includes a 4/8-bit 6800/8080-series parallel interface or serial interface.

23. The character display module as claimed in claim 21, wherein the character generator read-only memory of the panel control unit is electrically connected to the micro control integrated circuit and interiorly provided with a 64×8 bit multi-language character database.

24. The character display module as claimed in claim 21, wherein the character generator random-access memory of the panel control unit is electrically connected to the micro control integrated circuit and interiorly provided with a 100×16 plotting function.

25. The character display module as claimed in claim 21, wherein the reset integrated circuit of the panel control unit is electrically connected to the micro control integrated circuit to provide a reset function.

26. The character display module as claimed in claim 21, wherein the panel drive unit of the drive controller has a resolution of 5×8.

27. The character display module as claimed in claim 21, wherein the panel drive unit of the drive controller has a resolution of 5×10.

28. The character display module as claimed in claim 26, wherein the panel drive unit of the drive controller is electrically connected to the character generator read-only memory and the character generator random-access memory, respectively.

29. The character display module as claimed in claim 28, wherein the panel drive unit of the drive controller is provided with a common drive circuit, a section control circuit and a power supplying circuit.

30. The character display module as claimed in claim 29, wherein the power supplying circuit of the panel drive unit supplies a working power to the common drive circuit and the section control circuit by means of DC/DC conversion.

31. The character display module as claimed in claim 27, wherein the panel drive unit of the drive controller is electrically connected to the character generator read-only memory and the character generator random-access memory.

32. The character display module as claimed in claim 31, wherein the panel drive unit of the drive controller is provided with a common drive circuit, a section control circuit and a power supplying circuit.

33. The character display module as claimed in claim 32, wherein the power supplying circuit of the panel drive unit supplies a working power to the common drive circuit and the section control circuit by means of DC/DC conversion.

34. The character display module as claimed in claim 1, wherein the respective conductive components are made of liquid, solid or colloid elastic conductive material.

35. The character display module as claimed in claim 34, wherein the elastic conductive material is preferably conductive rubber, silver adhesive, carbon powder, anisotropic conductive film, or flexible flat cable.

36. The character display module as claimed in claim 1, wherein the frame is made of metal.

37. The character display module as claimed in claim 1, wherein the frame is made of non-metal.

38. The character display module as claimed in claim 20, wherein the first positioning portion and the second positioning portion of the frame each are provided with plural positioning protrusions, the positioning protrusions of the first positioning portion of the frame are inserted into the insertion holes and the through holes of the first assembling portion of the printed circuit board, and the positioning protrusions of the second positioning portion of the frame are inserted into the insertion holes and the through holes of the second assembling portion of the printed circuit board.

39. The character display module as claimed in claim 38, wherein the positioning protrusions of the first positioning portion each include a flexible end to be positioned on the printed circuit board, and the positioning protrusions of the second positioning portion each include a flexible end to be positioned on the printed circuit board.

40. The character display module as claimed in claim 38, wherein the first assembling portion and the second assembling portion of the printed circuit board are oppositely disposed, the first positioning portion and the second positioning portion of the frame are oppositely disposed, the first connecting portion and the second connecting portion of the character organic light emitting diode panel are oppositely disposed, the first connecting portion and the second connecting portion of the printed circuit board are oppositely disposed.

41. A character display module comprising:
a panel being provided with a first connecting portion and a second connecting portion;
a polarizing film being disposed on a light emission path of the panel;
a printed circuit board being provided with a first assembling portion and a second assembling portion, the printed circuit board being provided at one side of the first assembling portion thereof with a first connecting portion in alignment with the first connecting portion of the panel, and at one side of the second assembling portion thereof with a second connecting portion in alignment with the second connecting portion of the panel;
a drive controller including a panel control unit and a panel drive unit;
plural conductive components being disposed between the panel and the printed circuit board and connected to the first connecting portions and the second connecting portions of the printed circuit board and the panel, respectively, so that the panel is controlled and driven by the panel control unit and the panel drive unit of the drive controller; and
a frame being provided with a first positioning portion to be engaged to the first assembling portion of the printed circuit board, and a second positioning portion to be engaged to the second assembling portion of the printed circuit board, so that the panel is positioned on the printed circuit by the frame.

42. The character display module as claimed in claim 41, wherein the panel is a character organic light emitting diode panel.

43. The character display module as claimed in claim 41, wherein the first connecting portion and the second connecting portion of the panel are oppositely disposed.

44. The character display module as claimed in claim 41, wherein the first assembling portion and the second assembling portion of the printed circuit board are oppositely disposed.

45. The character display module as claimed in claim 41, wherein the first connecting portion and the second connecting portion of the printed circuit board are oppositely disposed.

46. The character display module as claimed in claim 41, wherein the first positioning portion and the second positioning portion of the frame are oppositely disposed.

* * * * *